(12) United States Patent
Moore et al.

(10) Patent No.: US 11,610,987 B2
(45) Date of Patent: Mar. 21, 2023

(54) NPNP LAYERED MOS-GATED TRENCH DEVICE HAVING LOWERED OPERATING VOLTAGE

(71) Applicant: Pakal Technologies, LLC, San Francisco, CA (US)

(72) Inventors: Paul M Moore, Hillsboro, OR (US); Vladimir Rodov, Seattle, WA (US); Richard A Blanchard, Los Altos Hills, CA (US)

(73) Assignee: PAKAL TECHNOLOGIES, INC, San Francisco, CA (US)

( * ) Notice: Subject to any disclaimer, the term of this patent is extended or adjusted under 35 U.S.C. 154(b) by 0 days.

(21) Appl. No.: 17/539,063

(22) Filed: Nov. 30, 2021

(65) Prior Publication Data
US 2022/0376095 A1 Nov. 24, 2022

Related U.S. Application Data

(60) Provisional application No. 63/190,026, filed on May 18, 2021.

(51) Int. Cl.
*H01L 29/745* (2006.01)
*H01L 29/423* (2006.01)

(52) U.S. Cl.
CPC .... *H01L 29/7455* (2013.01); *H01L 29/42308* (2013.01)

(58) Field of Classification Search
None
See application file for complete search history.

(56) References Cited

U.S. PATENT DOCUMENTS

| 2004/0084725 A1* | 5/2004 | Nishiwaki | H01L 29/0696 |
| | | | 257/E29.038 |
| 2014/0124829 A1* | 5/2014 | Andenna | H01L 29/7397 |
| | | | 438/138 |

* cited by examiner

*Primary Examiner* — Khaja Ahmad
(74) *Attorney, Agent, or Firm* — Patent Law Group; Brian Ogonowsky (57) ABSTRACT

An npnp layered switch is modified to have a composite anode structure. Instead of the continuous p-type bottom anode layer of a typical npnp IGTO device, thyristor, or IGBT, the composite anode is formed of a segmented p-type layer with gaps containing n-type semiconductor material. The n-type material forms a majority carrier path between the bottom anode electrode and the n-type collector of the vertical npn bipolar transistor. When a trenched gate is biased high, the majority carrier path is created between the bottom anode electrode and the top cathode electrode. Such a current path operates at very low operating voltages, starting at slightly above 0 volts. Above operating voltages of about 1.0 volts, the npnp layered switch operates normally and uses regenerative bipolar transistor action to conduct a vast majority of the current. The two current paths conduct in parallel.

20 Claims, 9 Drawing Sheets

NPNP LAYERED MOS-GATED TRENCH DEVICE HAVING LOWERED OPERATING VOLTAGE

CROSS-REFERENCE TO RELATED APPLICATIONS

This application is based on U.S. provisional application Ser. No. 63/190,026, filed May 18, 2021, by Paul M. Moore et al., assigned to the present assignee and incorporated herein by reference.

FIELD OF THE INVENTION

This invention relates to insulated-gate power devices, such as IGBTs, insulated-gate-controlled thyristors, insulated-gate turn off (IGTO) devices, and other types of MOS-gated semiconductor switches that use an npnp or pnpn layered structure and, in particular, to a "composite anode" design that lowers the minimum operating voltage of such a structure.

BACKGROUND

The invention is an improvement to many types of npnp or pnpn layered structures that use bipolar action for conduction, rather than strictly MOSFET action. The invention applies to vertical and lateral insulated-gate devices, although a vertical device will primarily be described in detail in the examples.

Figure 1:
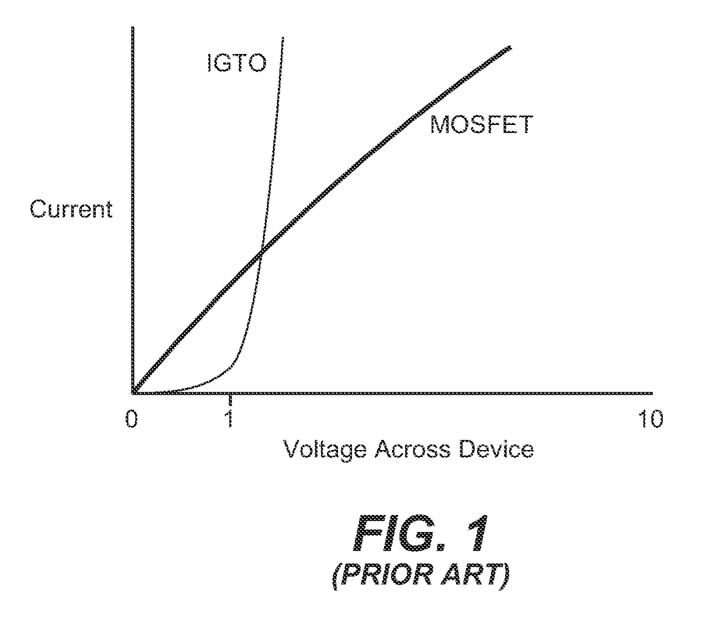
FIG. 1 is a current vs voltage graph for a typical IGTO (using bipolar action) and for a MOSFET.

In a vertical n-channel MOSFET, a trenched, insulated gate inverts a p-body layer, proximate to the trench walls, between an upper n+ source layer and a lower n-drain layer to create a conductive n-type channel between the two n-type layers. The current conduction is only by majority carriers. In contrast, in an npnp device, majority and minority carriers are part of the conduction mechanism. When turned on, an npnp device, such as an IGTO device, typically has a forward voltage (the voltage between its anode and cathode) that is lower than that of a vertical MOSFET for most of the current vs. voltage graph, as illustrated in FIG. 1. A lower forward voltage is highly desirable for high current devices to minimize heat and thereby improve device efficiency.

In FIG. 1, the current vs. voltage (I vs. V) of an IGTO device (an npnp device) is compared to that of a simple MOSFET. The MOSFET produces a fairly linear I vs. V curve and operates well even at very low voltages. The IGTO device, on the other hand, relies on bipolar transistor action, so its current is approximately zero when the anode-cathode voltage is less than about 1.0 volts. Above 1.0 volts, the bipolar regenerative action of the IGTO results in a low forward voltage with high currents.

What is needed is a new design for switches using an npnp or pnpn structure where the switch can conduct significant current at lower voltages, such as down to about 0 volts. Operating at such low operating voltages is required for some applications, so the more efficient npnp IGTO can be used instead of a MOSFET switch for such applications.

Figure 2:
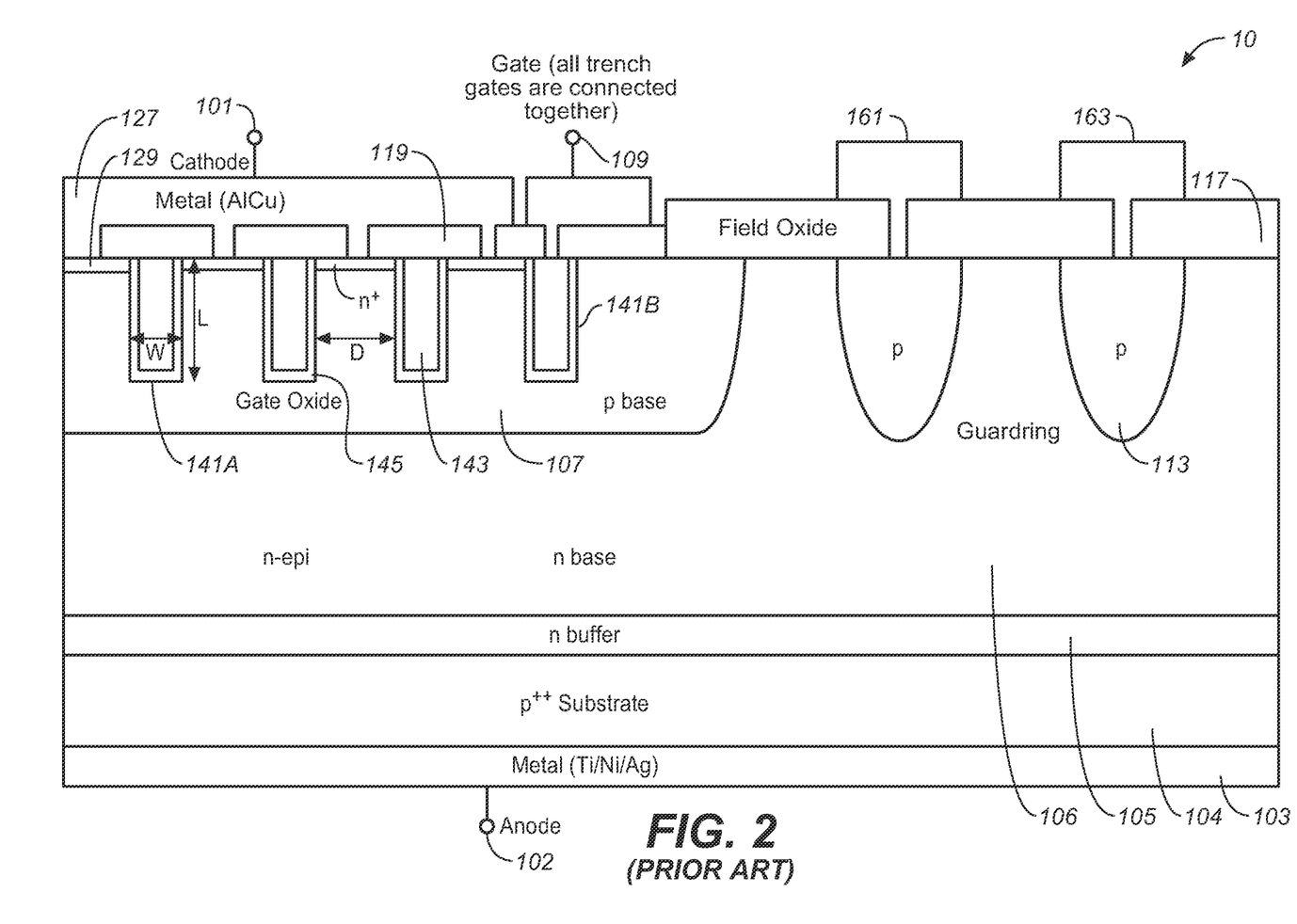
FIG. 2 is a cross-sectional view of an npnp layered vertical power switch described in Applicant's U.S. Pat. No. 8,878,238.

In FIG. 2, one example of a vertical conduction, npnp layered IGTO device 10 is described, although the invention can be used with virtually all types of npnp or pnpn layered structures to reduce the operating voltage.

Applicant's U.S. Pat. No. 8,878,238, incorporated by reference, discloses a vertical power device (an IGTO device) which will be used as an example of one of the many types of insulated-gate power devices that can benefit from the present invention. The insulated-gate power device from U.S. Pat. No. 8,878,238 will be described in detail, and the invention will later be described as a modification to such a device and related devices to lower the operating voltage.

Prior art FIG. 2 is a cross-sectional view of a small portion of a vertical power device described in U.S. Pat. No. 8,878,238. Although FIG. 2 just shows an edge portion of the cellular power device, the invention applies to all areas within the cellular array.

Three cells are shown having vertical gates 143 (e.g., doped polysilicon) formed in insulated trenches 141A. Trench 141B is for a polysilicon connection to all the gates 143 and may not be considered a cell. A 2-dimensional array of the cells forming, for example, strips or a rectangular mesh, may be formed in a common, lightly-doped p-well 107 (acting as a p-base), and the cells are connected in parallel.

N+ regions 129 surround some or all of the gates 143 and are contacted by a top, metal cathode electrode 127 having a cathode terminal 101. The n+ regions 129 may be formed by implantation or by other known dopant introduction methods.

The vertical gates 143 are insulated from the p-well 107 by an oxide layer 145. The gates 143 are connected together outside the plane of the drawing and are coupled to a gate voltage via a metal gate electrode 109 directly contacting the polysilicon in the trench 141B. A patterned dielectric layer 119 insulates the gate electrode 109 from the p-well 107 and insulates the gates 143 from the cathode electrode 127.

Guard rings 113 near the edge of the die reduce field crowding, thereby increasing the breakdown voltage. The guard rings 113 are contacted by metal 161 and 163, which are insulated from the n– drift layer 106 by field oxide 117.

A vertical npnp semiconductor layered structure is formed. There is a bipolar pnp transistor formed by a p+ substrate 104, an epitaxially grown n– drift layer 106 (acting as an n-base), and the p-well 107. There is also a bipolar npn transistor formed by the n+ regions 129, the p-well 107, and the n– drift layer 106. An n-type buffer layer 105, with a dopant concentration higher than that of the n– drift layer 106, reduces the injection of holes into the n– drift layer 106 from the p+ substrate 104 when the device is conducting. It also reduces the electric field at the anode pn-junction when the power device is reverse biased. A bottom anode electrode 103 contacts the substrate 104, and the top cathode electrode 127 contacts the n+ regions 129 and also contacts the p-well 107 at selected locations. The p-well 107 surrounds the gate structure, and the n– drift layer 106 extends to the surface around the p-well 107.

When the anode electrode 103, having an anode terminal 102, is forward biased with respect to the cathode electrode 127, but without a sufficiently positive gate bias, there is no current flow, since there is a reverse biased vertical pn junction, and the product of the betas (gains) of the pnp and npn transistors is less than one (i.e., there is no regeneration activity).

When the gate 143 is sufficiently biased with a positive voltage (relative to the n+ regions 129), such as 2-5 volts, an inversion layer is formed in the silicon adjacent to the gate oxide layer 145, and electrons from the n+ regions 129 become the majority carriers in this silicon region alongside and below the bottom of the trenches in the inversion layer, causing the effective width of the npn base (the portion of the p-well 107 between the n-layers) to be reduced. As a result, the beta of the npn transistor increases to cause the product of the betas to exceed one. This condition results in "breakover," when holes are injected into the lightly doped n− drift layer 106 and electrons are injected into the p-well 107 to fully turn on the device. Accordingly, the gate bias initiates the turn-on, and the full turn-on (due to regenerative action) occurs when there is current flow through the npn transistor as well as current flow through the pnp transistor.

When the gate bias is taken to zero, such as the gate electrode 109 being shorted to the cathode electrode 127, or taken negative, the device 10 turns off, since the effective base width of the npn transistor is increased to its original value.

The device is similar to many other types of high current/ high voltage insulated-gate power devices in that it is cellular and all the gates are connected together to a single driver.

The high-current voltage drop across the device is relatively low compared to that of a pure MOSFET device (see FIG. 1). However, as previously discussed, one advantage of a MOSFET is that it can conduct well at a lower operating voltage. Hence, it would be desirable to modify the device of FIG. 2, and other related npnp or pnpn devices, so it can more efficiently conduct current at lower operating voltages.

SUMMARY

In one embodiment, a vertical-conduction, npnp layered switch is modified to have a different "bottom" anode structure. Instead of the continuous p-type bottom anode layer of a typical npnp IGTO device, thyristor, or IGBT, the present invention forms a bottom "composite anode". The p-type semiconductor portion of the composite anode also acts as a p-type emitter for the vertical pnp transistor in the npnp structure.

The composite anode has a segmented p-type layer with gaps containing n-type semiconductor material (which is part of the overlying n-type collector for the vertical npn transistor in the npnp structure).

Below the segmented p-type layer is a segmented metal (or other conductor) layer, where a dielectric is between the segments. A small portion of the metal layer contacts the n-type regions in the segmented p-type layer.

A continuous anode electrode then contacts the bottom of the segmented metal layer.

Thus, there is a direct conductive path, using majority carriers only, between the bottom anode electrode and the n-type collector in the vertical npn transistor, via the n-type regions in the gaps in the segmented p-type layers, which bypasses the p-type anode layer altogether.

When the trenched gate is sufficiently positively biased (above the threshold voltage), and the operating voltage is a positive voltage that is much lower than the conventional minimum operating voltage of at least 1.0 volts, current begins to flow through the n-type regions in the gaps in the segmented p-type anode layer. The current path is essentially a resistive path. At this time, the npnp structure is not yet operating in the regenerative mode.

This majority carrier current path is in parallel with the npnp current path that is present when the device is fully on.

As the operating voltage (the anode-cathode voltage) increases above about 1.0 volts, the gaps in the segmented p-type anode layer continue to conduct current, but the main current path through the npnp structure turns on (due to regenerative action) to conduct a majority of the device's current. The current through the gaps in the segmented p-type anode layers may be 1-10% of the total current conducted in this instance.

The gaps in the segmented p-type anode layer essentially form a JFET, where the JFET operates in its saturated mode at higher voltages so the current is limited as the operating voltage increases due to partial depletion of the n-type material in the gaps. At low voltages/currents, the JFET operates in its linear region, providing a resistive path.

The composite anode can substitute for any p-type anode layer in a conventional npnp layered device to lower the allowable minimum operating voltage. The conductivities of the layers can be reversed to form a pnpn device.

The gate may be a trenched gate (for a vertical inversion layer) or a top "horizontal" gate (for a lateral inversion layer).

Other embodiments are disclosed.

BRIEF DESCRIPTION OF THE DRAWINGS

Elements that are the same or equivalent in the various figures may be labeled with the same numeral.

DETAILED DESCRIPTION

Figure 3:
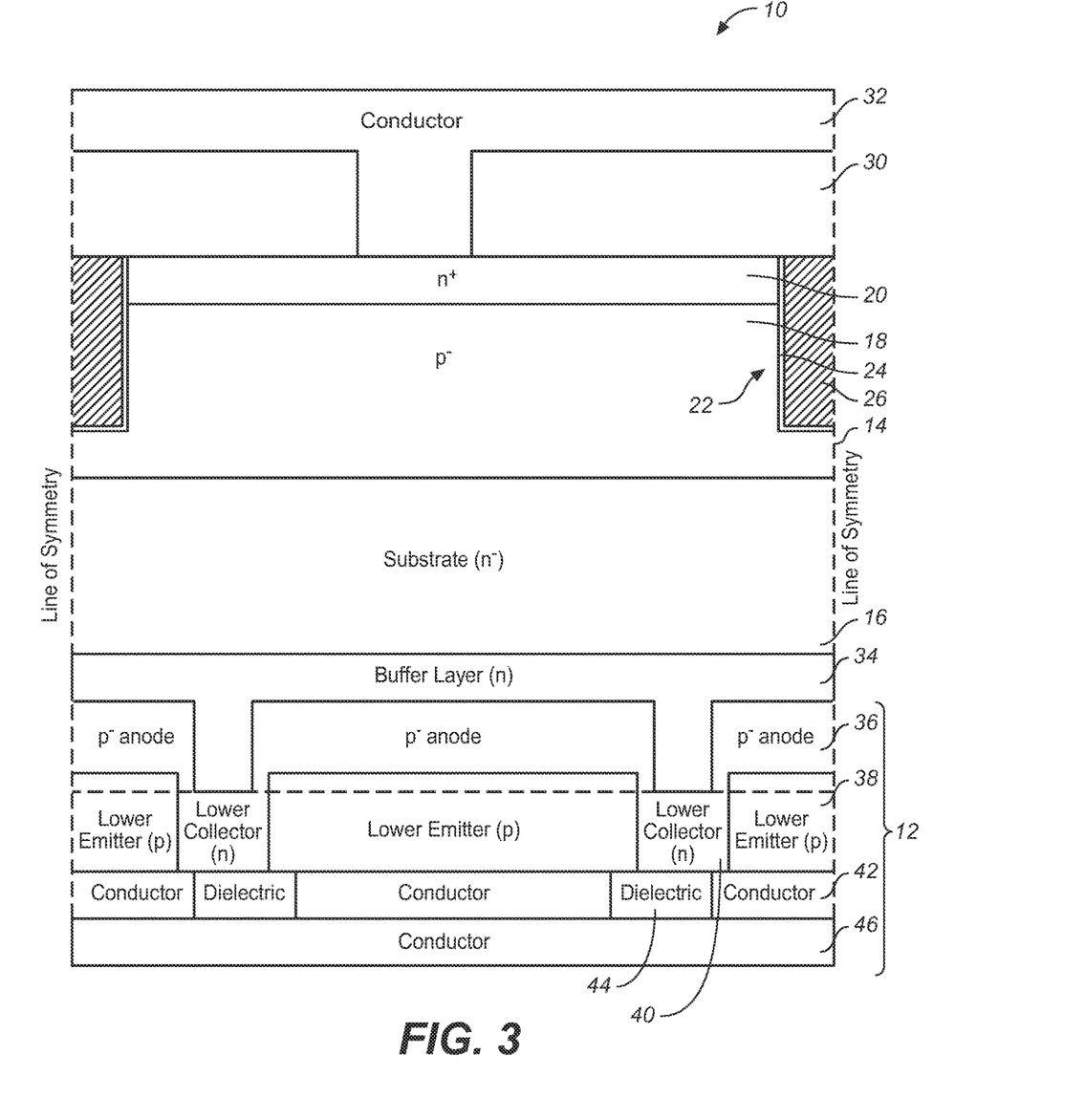
FIG. 3 is a cross-sectional view of an IGTO with a composite anode, in accordance with one embodiment of the invention.

FIG. 3 is a cross-sectional view of a small portion of an IGTO device 10 with a composite anode 12, in accordance with one embodiment of the invention. The structure above the composite anode 12 may be any suitable structure in an npnp device, and the example shows the top portion of the IGTO of FIG. 2. Only one cell is shown, and the device may have hundreds of cells connected in parallel in a 2-dimensional array. The gate trenches may form a mesh, to form rectangular or hexagonal cells, or may be parallel linear strips. The gates may also be top gates that create a horizontal inversion layer to control the device.

In the example, the structure repeats along the lines of symmetry 14.

A starting n-type substrate 16 has epitaxially grown over its top surface a p-type body layer 18 (or base of the npn transistor). The p-type body layer 18 may be doped while growing the layer. The p-type body layer 18 may instead be implanted and diffused to form a well. (A well is also considered a layer for purposes of this disclosure.)

The top surface of the p-type body layer 18 is then doped with n-type dopants, or an n-type epitaxial layer is grown, to form n+ source regions. 20 (or emitters of the npn transistor).

Trenches 22 are etched into the p-type body layer 18 and terminate within the p-type body layer 18. The walls and bottoms of the trenches 22 are then oxidized to form a gate oxide layer 24. The insulated trenches are then filled with doped polysilicon 26 to form an array of insulated gates.

In another embodiment, the trenches 22 extend into the substrate 16 so that an inverted n-channel extends between the n+ source regions 20 and the substrate 16 when the gates are positively biased.

A dielectric layer 30 is then deposited over the surface and etched to expose portions of the n+ source regions 20. Elsewhere, the dielectric layer 30 is etched to form a gate electrode (shown in FIG. 2) contacting the interconnected polysilicon 26 in the trenches 22.

A metal layer is then deposited and etched to form a cathode electrode 32 (or source electrode) and a gate electrode. The metal extends through the openings in the dielectric layer 30 to contact the n+ source regions 20. The metal may also short the p-type body layer 18 to the n+ source regions 20 in some areas on the die to weakly bias the p-type body layer 18.

On the bottom surface of the substrate 16 is grown or implanted an n-buffer layer 34, having a doping concentration higher than that of the n-type substrate 16.

A mask is then formed, and p-type dopants are implanted to form a segmented p-type anode layer 36 (or emitter of the pnp transistor).

A layer comprising p-type lower emitter regions 38 and n-type lower collector regions 40 is then formed my implantation or by epitaxial growth and implantation. The n-type lower collector regions 40 generally align with the gaps in the segmented p-type anode layer 36 so the n-type lower collector regions 40 form a continuous conductive path to the n-type buffer layer 34 and the substrate 16.

Next, a metal (or other conductor) layer 42 is deposited and etched to form openings that are filled with a dielectric 44, such as oxide. Part of the metal layer 42 directly contacts the n-type lower collector regions 40. The amount of contact is important since this determines the low operating voltage current flow. It is easier to precisely etch the metal layer 72 to set the contact area rather than precisely size the n-type lower collector regions 40 due to diffusion of the n-type dopants.

On the bottom surface is formed a metal anode electrode 46.

The "high" voltage operation of the IGTO of FIG. 3 has been generally described with respect to FIG. 2. This high voltage is anything above about 1.0 volts where the bipolar transistor action and regeneration are used to conduct a vertical current with a very low voltage drop. Below about 1.0 volts between the electrodes 32 and 46, the bipolar transistors cannot turn on.

When the gates are positively biased, to conduct a current for a low operating voltage (anode to cathode electrode voltage) starting slightly above 0 volts, a current path is formed by the anode electrode 46, the metal layer 42, the n-type lower collector regions 40, the n-type buffer layer 34 in the gaps, the n-type substrate 16, an n-inversion layer around the trenches 22, the n+ source regions 20, and the cathode electrode 32. There is only majority carrier flow through the n-type path in this mode, unlike in the bipolar regenerative mode.

The gaps between the p-type regions in the segmented p-type anode layer 36 act like resistors with low operating currents and low operating voltages. In contrast, at high operating voltages the gaps act like JFETs in their saturation mode, where the current is pinched off by the n-type material in the gaps being depleted as the operating voltage increases. This results in a generally fixed maximum current through that path at the higher operating voltages and a linear current at the low voltages below about 1.0 volts. At low operating voltages, the current through the device is usually adequate for most applications prior to bipolar action taking place.

At higher operating voltages, the current flow by bipolar action dwarfs the current flow via the n-type lower collector regions 40, so efficiency is not significantly reduced with the present invention. The two current flow paths/actions essentially operate in parallel at the higher operating voltages, and only the gaps/JFETs provide current flow in the range of 0-1.0 volts.

In one embodiment, at the high operating voltages, the current flow through the n-type lower collector regions 40 is between 1-5% of the total current and may be as high as 10%, depending on the application. The percentage of current flow is determined by the size and number of the gaps in the segmented p-type anode layer 36 and the area of contact between the metal layer 42 and the n-type lower collector regions 40.

Figure 4:
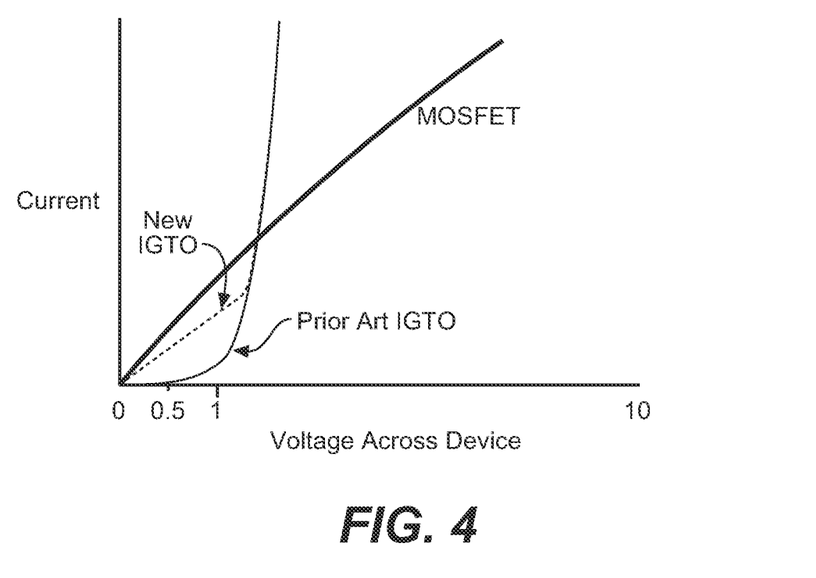
FIG. 4 is a current vs voltage graph of the device of FIG. 3 showing the lowered minimum operating voltage.

Simulation shows that the device of FIG. 3 produces a current vs. voltage (I vs. V) curve that is more linear between 0 and about 1.0 volts with no significant reduction in breakdown voltage. FIG. 4 contrasts the I vs. V curve of the prior art IGTO device of FIG. 2 with the curve of the new IGTO of FIG. 3 and that of a MOSFET. At high operating voltages, the I vs. V curves of the devices of FIGS. 2 and 3 generally overlap due to the regenerative action.

Although FIG. 3 shows the composite anode 12 being aligned with cells in the IGTO device 10, the composite anode 12 does not need to be aligned, and the percentage of current flow through the n-type lower collector regions 40 may also be determined by the distribution of the gaps in the segmented p-type anode layer 36.

Figure 5:
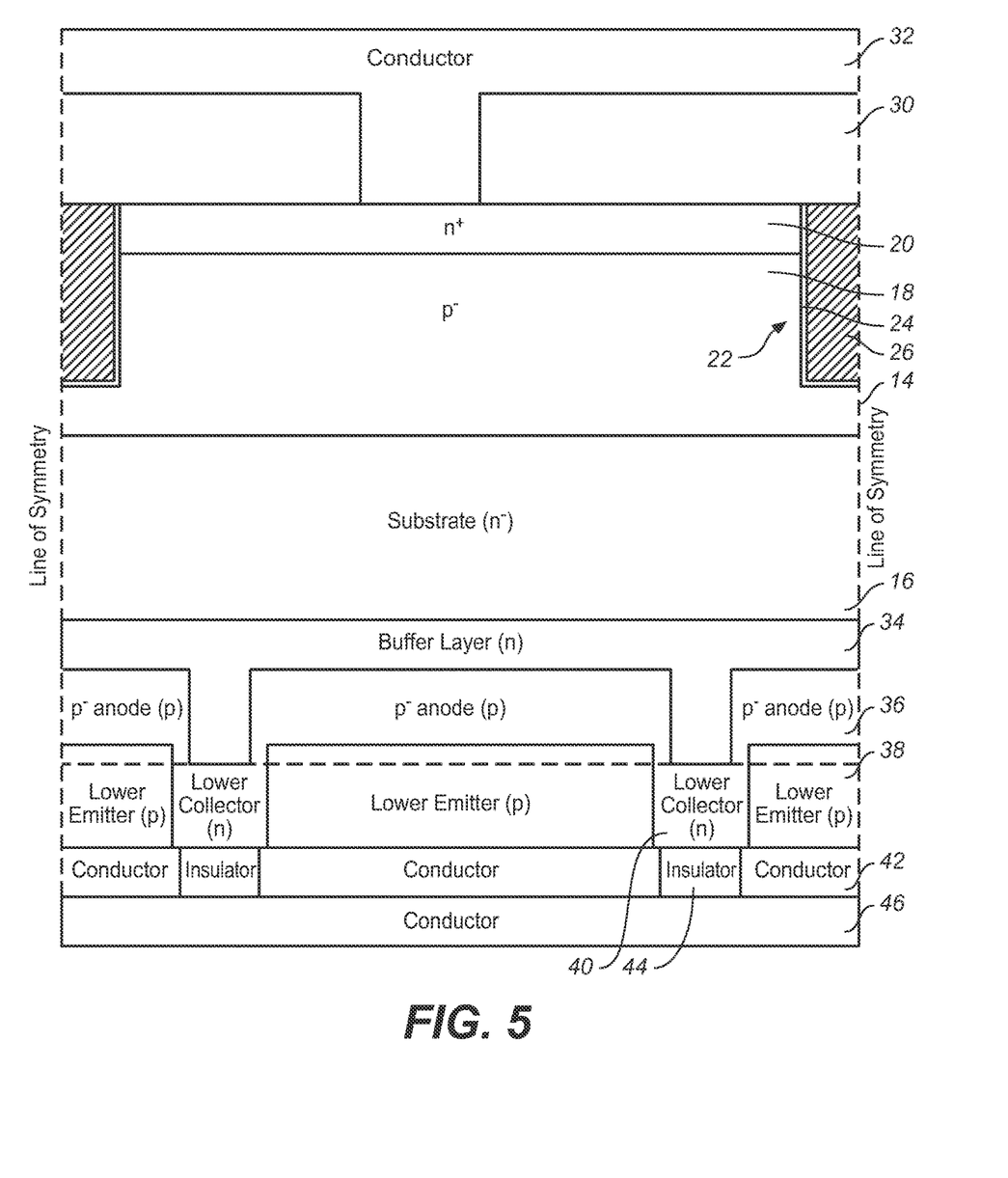
FIG. 5 is a cross-sectional view of an IGTO with a composite anode, in accordance with another embodiment of the invention.

FIG. 5 illustrates a modification to FIG. 3, where the metal layer 42 contacts the n-type lower collector regions 40 on both sides rather than on only one side shown in FIG. 3. This arrangement increases the maximum current flow in the low voltage mode.

Figure 6:
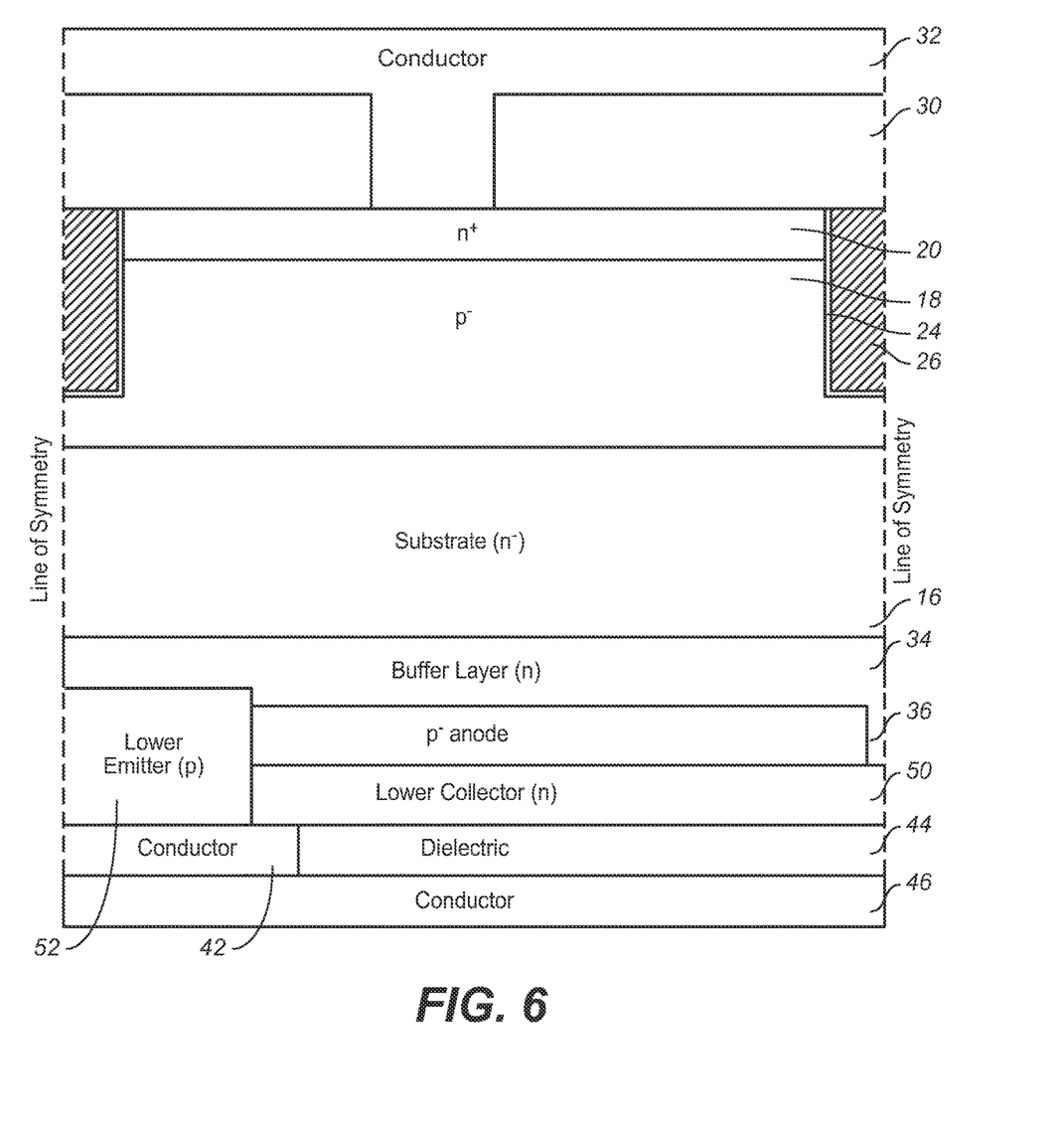
FIG. 6 is a cross-sectional view of an IGTO with a composite anode, in accordance with another embodiment of the invention.

FIG. 6 illustrates another embodiment of the composite anode where the n-type lower collector region 50 contacts the n-type buffer layer 34 on the right side of the figure. Also, a p-type lower emitter region 52 extends from the metal layer 42 to the n-type buffer layer 34.

Figure 7:
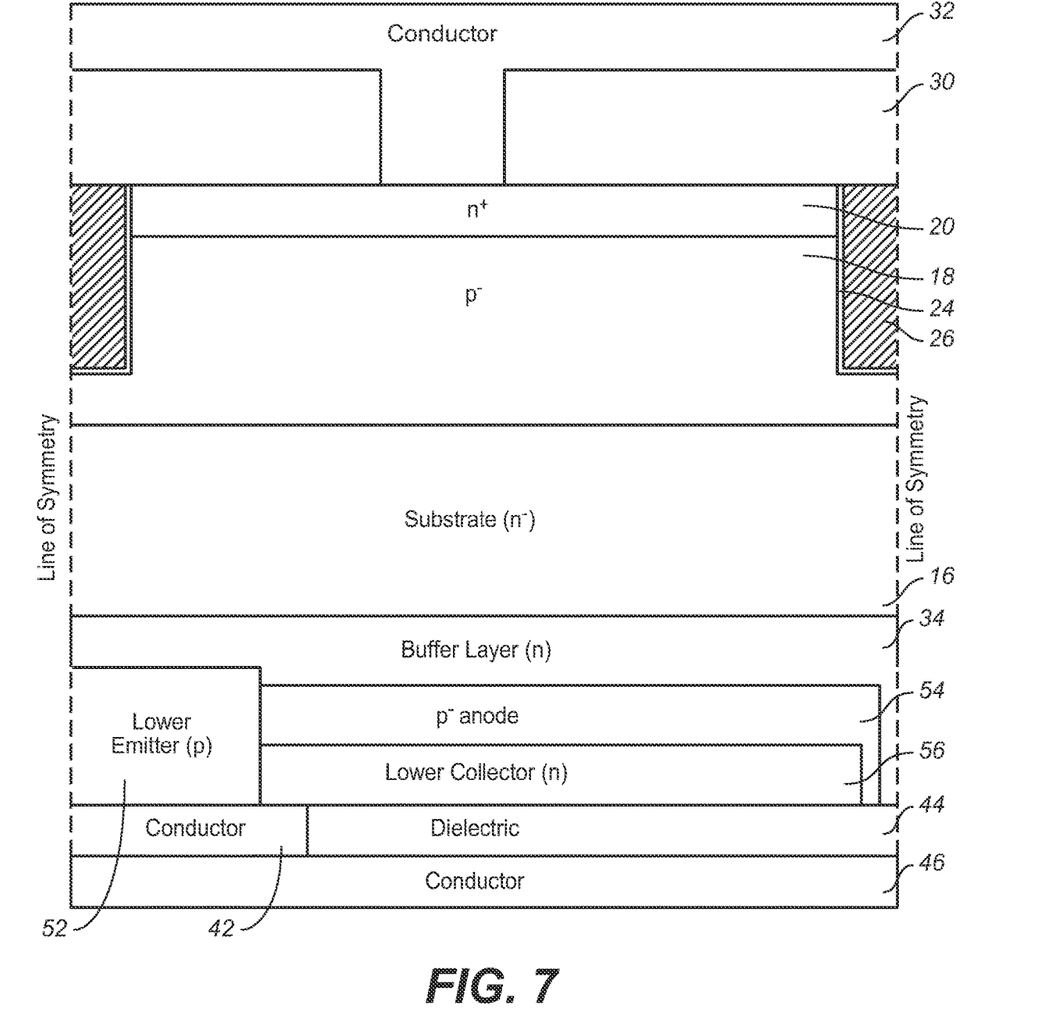
FIG. 7 is a cross-sectional view of an IGTO with a composite anode, in accordance with another embodiment of the invention.

In FIG. 7, the dielectric 44 is formed thin to act as a gate oxide. The positive potential on the anode electrode 46 inverts the bottom of the segmented p-type anode layer 54 adjacent to the dielectric 44 to form an n-channel path between the n-type lower collector region 56 and the n-type buffer layer 34.

Figure 8:
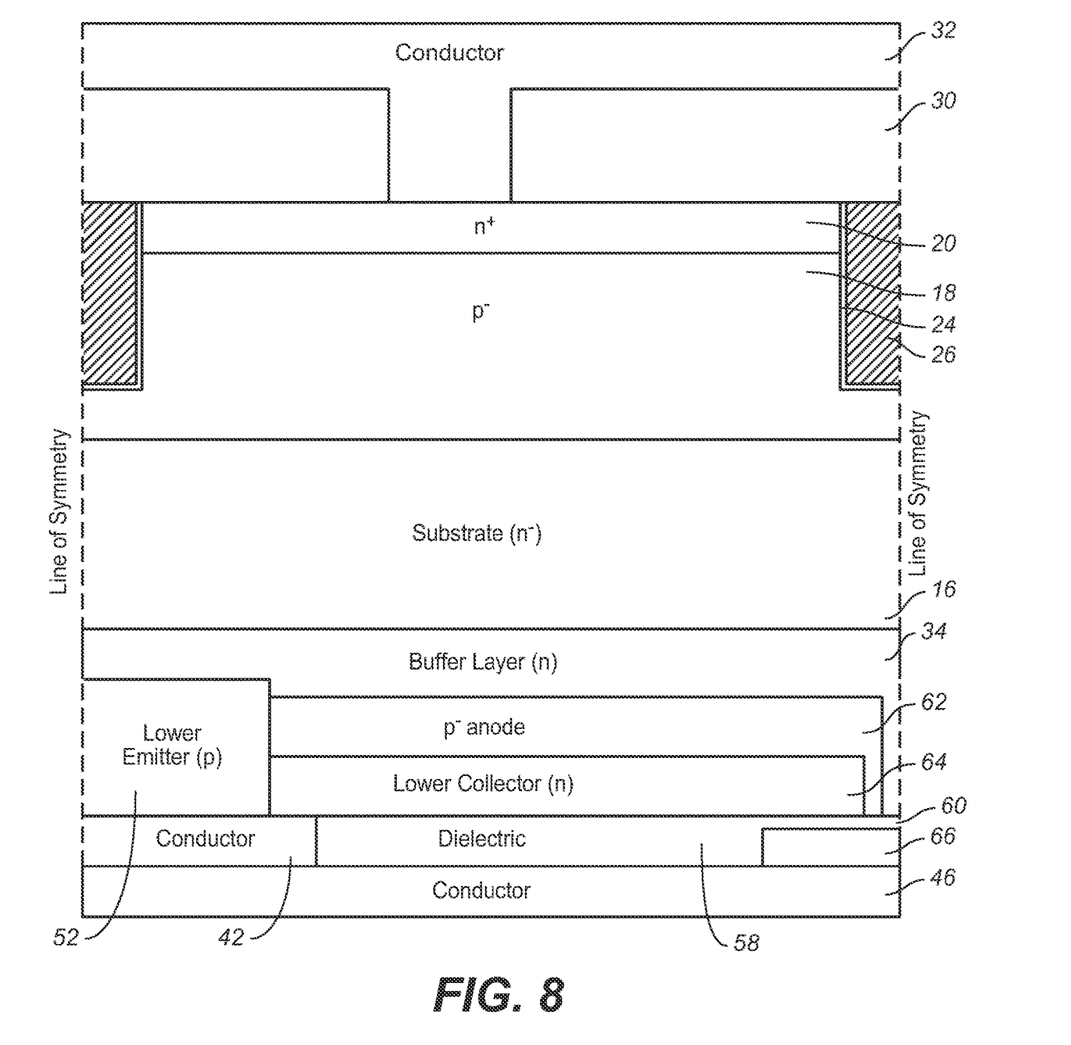
FIG. 8 is a cross-sectional view of an IGTO with a composite anode, in accordance with another embodiment of the invention.

FIG. 8 is similar to FIG. 7 but there is a "thick" dielectric layer portion 58 and a very thin dielectric layer portion 60 for inverting the bottom of the p-type segmented anode layer 62 to create an n-channel current path between the n-type lower collector region 64 and the n-type buffer layer 34. The anode electrode 46 has a metal extension 66 that abuts the thin dielectric layer portion 60.

The devices of FIGS. 5-8 operate like the device of FIG. 3 when the operating voltage is sufficiently high, except for the parallel current path provided by the composite anode, so there is no need to describe such bipolar operation again.

Figure 9:
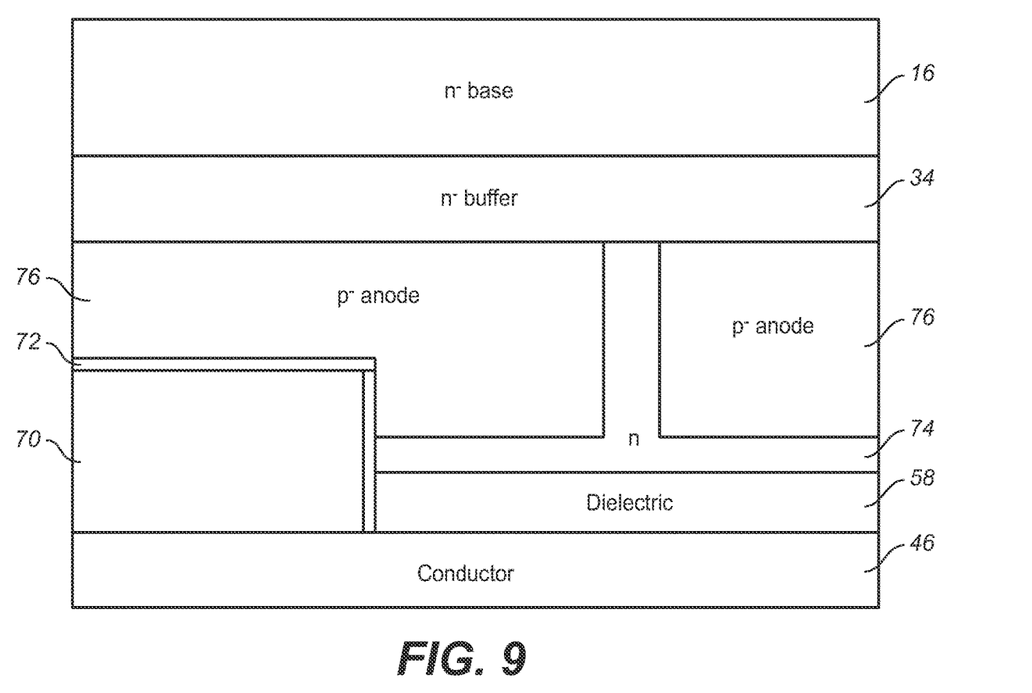
FIG. 9 is a cross-sectional view of a bottom portion of a vertical switch showing a composite anode, which may be used with many types of npnp or pnpn layered devices.

FIG. 9 illustrates the bottom portion of an IGTO device, or any other suitable device, where the metal anode electrode 46 is connected to a tungsten plug 70 with an outer layer of titanium nitride 72. The upper gate structure (not shown) can be any suitable structure used in IGTOs, thyristors, IGBTs, etc. An n-type lower collector region 74 has an edge that contacts the titanium nitride 72. The n-type lower collector region 74 contacts the n-type buffer layer 34 via a gap in the segmented p-type anode layer 76. The current at low voltages can be easily controlled by the length of the n-type lower collector layer 74 path to the n-type buffer layer 34 and/or by the gap width, or by other techniques.

FIG. 9 may also be a horizontal cross-section through a lateral npnp structure having a composite anode. In a lateral device, an upper horizontal gate may turn the device on, causing lateral and vertical currents to flow between two top electrodes or between a top electrode and a bottom electrode.

Many other configurations of composite anodes can be formed using the concepts described herein, where a majority carrier, n-conductivity type path is used to conduct current at low operating voltages and operates in parallel with the main bipolar action path at higher operating voltages.

The conductivity types may be reversed to form a pnpn type device.

Although the embodiments have described the device as layers on a "substrate", the various layers may be epitaxially grown on a starting substrate, or the layers may be implanted such that the various layers are part of the substrate. Accordingly, the substrate may be considered as another semiconductor layer or layers having a certain conductivity or conductivities.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A layered, gate controlled semiconductor device comprising:
   a first metal electrode;
   a first layer of a first conductivity type in electrical contact with the first metal electrode;
   a second layer of a second conductivity type abutting the first layer;
   insulated gates configured for inverting a portion of the second layer of the second conductivity type when the gates are biased with a voltage;
   a third layer of the first conductivity type abutting the second layer;
   a fourth layer of the second conductivity type abutting the third layer to form a layered structure of npnp or pnpn so that bipolar transistor action creates a first current path when the device is turned on with an operating voltage above a first threshold,
   wherein the fourth layer of the second conductivity type is segmented to form gaps containing semiconductor material of the first conductivity type; and
   a second metal electrode that makes electrical contact to the semiconductor material of the first conductivity type in the gaps so a majority carrier second current path is created, when the gate is biased with the voltage, between the second metal electrode, the semiconductor material of the first conductivity type in the gaps, the third layer of the first conductivity type, the first layer of the first conductivity type, and the first metal electrode,
   wherein the second current path conducts current when the operating voltage is below the first threshold, and the second current path in parallel with the first current path conducts current when the operating voltage is above the first threshold.

2. The device of claim 1 wherein the second metal electrode makes electrical contact to the semiconductor material of the first conductivity type in the gaps by direct contact with the semiconductor material of the first conductivity type.

3. The device of claim 1 further comprising a first dielectric material between the semiconductor material of the first conductivity type and the second metal electrode, wherein a voltage on the second metal electrode inverts a portion of the fourth layer of the second conductivity type abutting the first dielectric material to form a conductive channel between the semiconductor material of the first conductivity type and the third layer of the first conductivity type.

4. The device of claim 1 further comprising a first metal layer between the second metal electrode and the fourth layer of the second conductivity type, the first metal layer being segmented and including dielectric portions, wherein the first metal layer provides a current path between the second metal electrode and the semiconductor material of the first conductivity type.

5. The device of claim 1 further comprising a first metal layer extending from the second metal electrode that directly contacts the semiconductor material of the first conductivity type.

6. The device of claim 1 wherein the gaps in the fourth layer act as JFETs to control the current through the second current path.

7. The device of claim 1 further comprising cells containing the gates, wherein the cells are connected in parallel.

8. The device of claim 7 further comprising trenches in at least the second layer of the second conductivity type, the trenches containing a conductor to form the insulated gates.

9. The device of claim 8 wherein the trenches terminate in the second layer of the second conductivity type.

10. The device of claim 1 wherein the insulated gates, when inverting the portion of the second layer of the second conductivity type, increase a beta of a vertical bipolar transistor to cause bipolar transistor conduction between the first metal electrode and the second metal electrode.

11. The device of claim 1 wherein the insulated gates, when inverting the portion of the second layer of the second conductivity type, increase a beta of a vertical bipolar transistor to cause regenerative bipolar transistor conduction between the first metal electrode and the second metal electrode.

12. The device of claim 1 wherein the first conductivity type is n-type and the second conductivity type is p-type.

13. The device of claim 1 wherein the semiconductor device is a vertical switch, wherein the first metal electrode is a top electrode, the first layer is below the first metal electrode, the second layer is below the first layer, the third layer is below the second layer, and the fourth layer is below the third layer to form a vertical npnp or vertical pnpn structure, and
   wherein the second metal electrode is a bottom electrode.

14. The device of claim 13 further comprising trenches in at least the second layer of the second conductivity type, the trenches containing a conductor to form the insulated gates.

15. A layered, gate controlled semiconductor device comprising:
   an upper first metal electrode;

a first layer of a first conductivity type below and abutting the first metal electrode;

a second layer of a second conductivity type below and abutting the first layer;

insulated gates, formed in trenches at least in the second layer, configured for inverting a portion of the second layer of the second conductivity type when the gates are biased with a voltage;

a third layer of the first conductivity type below and abutting the second layer;

a fourth layer of the second conductivity type below and abutting the third layer to form a vertically layered structure of npnp or pnpn so that bipolar transistor action creates a generally vertical first current path when the device is turned on with an operating voltage above a first threshold, wherein the fourth layer of the second conductivity type is segmented to form gaps containing semiconductor material of the first conductivity type; and a bottom second metal electrode that makes electrical contact to the semiconductor material of the first conductivity type in the gaps so a majority carrier second current path is created, when the gate is biased with the voltage, between the second metal electrode, the semiconductor material of the first conductivity type in the gaps, the third layer of the first conductivity type, the first layer of the first conductivity type, and the first metal electrode, wherein the second current path conducts current when the operating voltage is below the first threshold, and the second current path in parallel with the first current path conducts current when the operating voltage is above the first threshold.

16. The device of claim 15 wherein the second metal electrode makes electrical contact to the semiconductor material of the first conductivity type in the gaps by direct contact with the semiconductor material of the first conductivity type.

17. The device of claim 15 further comprising a first dielectric material between the semiconductor material of the first conductivity type and the second metal electrode, wherein a voltage on the second metal electrode inverts a portion of the fourth layer of the second conductivity type abutting the first dielectric material to form a conductive channel between the semiconductor material of the first conductivity type and the third layer of the first conductivity type.

18. The device of claim 15 further comprising a first metal layer between the second metal electrode and the fourth layer of the second conductivity type, the first metal layer being segmented and including dielectric portions, wherein the first metal layer provides a current path between the second metal electrode and the semiconductor material of the first conductivity type.

19. The device of claim 15 further comprising a first metal layer extending from the second metal electrode that directly contacts the semiconductor material of the first conductivity type.

20. The device of claim 15 wherein the insulated gates, when inverting the portion of the second layer of the second conductivity type, increase a beta of a vertical bipolar transistor to cause bipolar transistor conduction between the first metal electrode and the second metal electrode.

* * * * *